(12) United States Patent
Nishiguchi et al.

(10) Patent No.: US 7,826,507 B2
(45) Date of Patent: Nov. 2, 2010

(54) SEMICONDUCTOR LASER DEVICE INCLUDING HIGHLY REFLECTIVE COATING FILM

(75) Inventors: Harumi Nishiguchi, Tokyo (JP); Hiromasu Matsuoka, Hyogo (JP); Yasuyuki Nakagawa, Tokyo (JP); Yasuhiro Kunitsugu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 169 days.

(21) Appl. No.: 12/022,194

(22) Filed: Jan. 30, 2008

(65) Prior Publication Data

US 2008/0273556 A1 Nov. 6, 2008

(30) Foreign Application Priority Data

May 1, 2007 (JP) .............................. 2007-121055

(51) Int. Cl.
*H01S 5/00* (2006.01)
(52) U.S. Cl. .................................................... 372/49.01
(58) Field of Classification Search ............... 372/49.01
See application file for complete search history.

(56) References Cited

U.S. PATENT DOCUMENTS

| 5,943,356 | A | 8/1999 | Kawai |
| 6,798,811 | B1 | 9/2004 | Sugahara et al. |
| 6,990,133 | B2 | 1/2006 | Kikawa et al. |
| 7,003,009 | B2 | 2/2006 | Arakida et al. |
| 7,039,085 | B2 | 5/2006 | Kunitsugu et al. |
| 2004/0233959 | A1 | 11/2004 | Arakida |

FOREIGN PATENT DOCUMENTS

| JP | 6-224514 | 8/1994 |
| JP | 9-326527 | 12/1997 |
| JP | 2000-22269 | 1/2000 |
| JP | 2002-305348 | 10/2002 |
| JP | 2003-264333 | 9/2003 |
| JP | 2004-327581 | 11/2004 |
| JP | 2004-327678 | 11/2004 |
| JP | 2005-175111 | 6/2005 |
| JP | 2006-165478 | 6/2006 |

*Primary Examiner*—Minsun Harvey
*Assistant Examiner*—Marcia A. Golub-Miller
(74) *Attorney, Agent, or Firm*—Leydig, Voit & Mayer, Ltd.

(57) ABSTRACT

A semiconductor light-emitting device includes a light generation unit generating light with an oscillation wavelength $\lambda$, a light outgoing facet from which light generated at the light generation unit emerges, a light reflecting facet at which light generated at the light generation unit is reflected, and a high reflection film at the light reflecting facet and made of a dielectric multilayered film of at least three layers. The high reflection film includes a first layer which is in contact with the light reflection facet, is constituted of $Al_2O_3$, and has a thickness smaller than $\lambda/4n$, wherein n is the refractive index of $Al_2O_3$, a second layer which is in contact with the first layer, and a third layer which is in contact with the second layer and has a refractive index different from the refractive index of the second layer.

17 Claims, 2 Drawing Sheets

SEMICONDUCTOR LASER DEVICE INCLUDING HIGHLY REFLECTIVE COATING FILM

BACKGROUND OF THE INVENTION

1. Field of the Invention

This invention relates to a semiconductor light-emitting device and more particularly, to a semiconductor laser device suited for use in short wavelength and high output applications.

2. Background Art

With optical recording devices such as an optical disc, a further increase in information recording amount has been demanded. In order to increase the information recording amount in optical recording devices, it is needed that the semiconductor light-emitting devices be shorter in wavelength and higher in output power.

Semiconductor laser devices have a problem in that if light absorption in coating films takes place, an optical absorption loss becomes so great that degradation of characteristics, such as a rise in operating current, is induced and heat is generated by the optical absorption of the coating film, thereby causing degradation at the facet called COD (catastrophic optical damage) and making it impossible to obtain desired optical output power. COD is a phenomenon wherein a facet of a semiconductor laser device locally absorbs light and becomes high in temperature, thereby melting and recrystallization of the semiconductor material at the facet of the semiconductor laser device.

Semiconductor laser devices have at least two facets including a light output facet called "front facet" and a light reflection facet called "rear facet". Generally, in high power semiconductor lasers, a low reflectance coating film is formed on the front facet, and a high reflectance coating film is formed on the rear facet. Specifically, the reflectance of the coating film on the rear end face is typically 70% or higher, preferably 90% or higher. The reflectance of the coating film on the front end face, on the other hand, is determined based on the required characteristics of the semiconductor laser (Lower reflectance does not necessarily guarantee higher laser performance.) General high power semiconductor lasers, on the other hand, employ a coating film having a reflectance of approximately 3-7%, or a coating film having a reflectance of approximately 7-20% when it is necessary to prevent return of light.

The characteristics of this high reflection film are important so as to suppress the characteristic degradation of a semiconductor laser, COD and the like. The respective reflection films serve to protect the facet as well.

The high reflection film (high reflection coating) of a semiconductor laser disclosed in JP-A-Hei-6-224514 has the following configuration so as to improve a heat spreading characteristic and prevent COD at the rear facet on which the high reflection film is formed. More particularly, a Si film whose thermal conductivity is high is made thick and an $Al_2O_3$ film whose thermal conductivity is low is made thin. The high reflection film of the semiconductor laser disclosed in JP-A-Hei-6-224514 is formed in this way and is improved in heat spreading, thereby preventing COD.

The reflection film of the semiconductor laser set out hereinabove in JP-A-Hei-6-224514 relating to a conventional technique is excellent in heat spreading in the semiconductor laser. However, lowering of optical absorption of the high reflection film is not taken into account. Blue semiconductor lasers also have another problem with regard to the coating films. Since the wavelength of the laser beam of these semiconductor lasers is short, the coating films have a high optical absorption coefficient and hence tend to degrade, as compared to conventional semiconductor lasers. Further, since conventional coating films do not adequately function as passivation films, the crystalline structure of the end face portions of the laser may be degraded, resulting in a reduced COD threshold. This has inhibited high output power of the semiconductor laser.

[Patent Literature 1] JP-A-Hei-6-224514
[Patent Literature 2] JP-A-Hei-9-326527
[Patent Literature 3] JP-A-2003-264333
[Patent Literature 4] JP-A-2004-327678
[Patent Literature 5] JP-A-2002-305348
[Patent Literature 6] JP-A-2006-165478
[Patent Literature 7] JP-A-2005-175111
[Patent Literature 8] JP-A-2004-327581

SUMMARY OF THE INVENTION

The present invention has been accomplished so as to solve the above problem and its object is to provide a semiconductor laser device wherein optical absorption of a high reflection film formed at rear facet is suppressed, thereby suppressing COD of the semiconductor laser device.

According to one aspect of the present invention, semiconductor laser device comprises a cavity formed to extend in a propagation direction of a laser beam. A first facet is formed on one end of the cavity to emit the laser beam. A second facet is formed on the other end of the cavity to reflect the laser beam. And a high reflection film formed at a side of said light reflecting facet, which made of an insulating and coating multi-layered film of at least three layers or more. The high reflection film includes, a first layer which is in contact with said light reflection facet, is constituted of $Al_2O_3$ and has a thickness smaller than $\lambda/4n$ wherein $\lambda$ is the wavelength of the laser beam and n is a refractive index of $Al_2O_3$, a second layer which is in contact with said first layer and is constituted of any of $SiO_2$, $MgF_2$, NaF, $Ca_2F$, $CeF_3$, $LaF_3$, LiF and $NdF_3$, and a third layer which is in contact with said second layer and has a refractive index different from said second layer.

Other and further objects, features and advantages of the invention will appear more fully from the following description.

DETAILED DESCRIPTION OF THE PREFERRED EMBODIMENTS

First Embodiment

Figure 1:
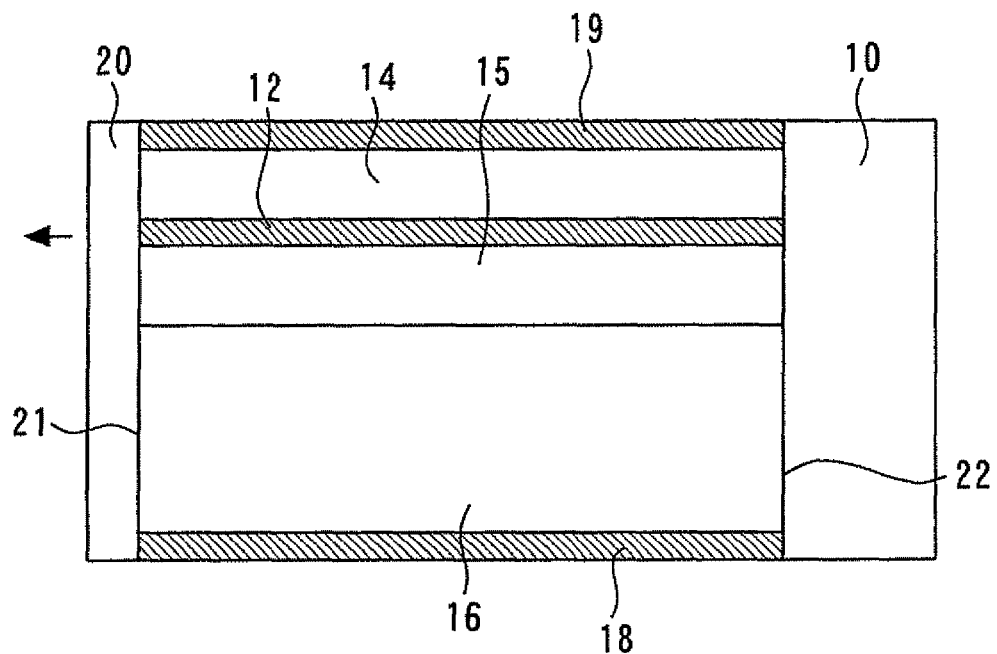
FIG. 1 is a diagram illustrating a semiconductor laser according to a first embodiment.

FIG. 1 is a diagram illustrating a semiconductor laser according to a first embodiment of the present invention. The semiconductor laser according to the first embodiment has a substrate 16. An electrode 18 is formed on a back side of the substrate 16. The substrate 16 has a cladding layer 15 of a first conduction type formed on the surface thereof. An active layer 12 is formed on the cladding layer 15. The active layer 12 is a layer wherein light is emitted by recombination of carriers. A cladding layer 14 of a second conduction type is formed on the active layer 12. The cladding layers 15, 14 are each a layer for increasing a carrier density in the active layer 12. An electrode 19 is formed on the cladding layer 14. After completion of the process of forming the semiconductor laser device having such a structure as set forth above, the wafer is cleft in position.

According to the cleavage of the wafer as mentioned above, there appear a light output facet called "front facet 21" formed on one end thereof to emit the laser beam and a light reflection facet called "rear facet 22" formed on the other end. A low reflection film 20 is formed on the front facet 21. The low reflection film 20 is a insulating and coating multi-layered film. The low reflection film 20 protects the front facet 21 of the semiconductor laser device. In general, the low reflection film 20 is formed so that its reflectance is lower than that of the semiconductor laser device. A high reflection film 10 is formed on the rear facet 22. The high reflection film 10 is a insulating and coating multi-layered film. One of the purposes of the formation of the high reflection film 10 is to protect the semiconductor laser device. The high reflection film is required to have a high reflectance and suppress an optical loss. The high reflection film generally has a reflectance of not lower than 70%, more preferably not lower than 90%. The reflectance of the high reflection film as described above is required to be high in order to extend the life of the semiconductor laser device.

Figure 2:
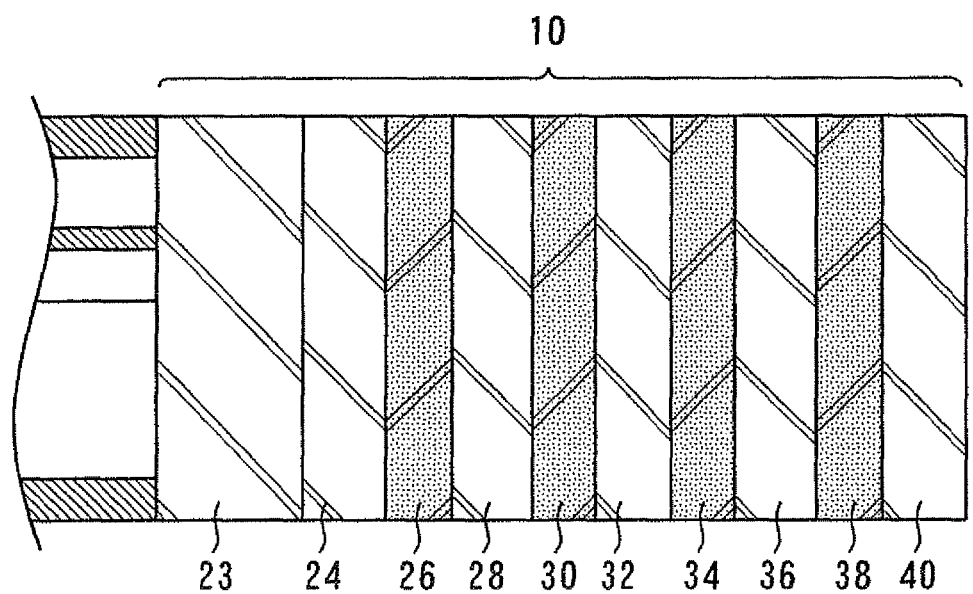
FIG. 2 is a diagram illustrating the arrangement of the high reflection film.

The present invention is characterized in the high reflection film. FIG. 2 is a diagram illustrating the arrangement of the high reflection film 10. As stated hereinabove, the high reflection film 10 is a insulating and coating multi-layered film. A first layer 23 is formed at a position in contact with the rear facet 22 of this embodiment. The main purpose of forming the first layer 23 is to attain good adhesion to the rear facet 22. This first layer 23 is in the form of a film made of $Al_2O_3$. The thickness of the first layer 23 of the embodiment is any value smaller than a value obtained by dividing the oscillation wavelength λ of a laser by four times the refractive index of the $Al_2O_3$ film. Hence, when the thickness of the first layer 23 is taken as d, d satisfies the following equation (1)

$$d < \lambda/4n \qquad \text{equation (1)}$$

The refractive index of the $Al_2O_3$ film is about 1.6 with the case of a laser beam having an oscillation wavelength of 405 nm. If λ is 405 nm and n is 1.6, λ/4n is equal to about 63 nm. In this embodiment, the first layer 23 has a thickness of 10 nm, which meets the equation (1).

A second layer 24 is formed in contact with the first layer 23. The second layer 24 is constituted of $SiO_2$.

A third layer 26 is formed in contact with the second layer 24. The third layer 26 is formed of $Ta_2O_5$.

A fourth layer 28 is formed in contact with the third layer 26. The fourth layer 28 is formed of $SiO_2$.

A fifth layer 30 is formed in contact with the fourth layer 28. The fifth layer 30 is formed of $Ta_2O_5$.

A sixth layer 32 is formed in contact with the fifth layer 30. The sixth layer 32 is formed of $SiO_2$.

A seventh layer 34 is formed in contact with the sixth layer 32. The seventh layer 34 is formed of $Ta_2O_5$.

An eighth layer 36 is formed in contact with the seventh layer 34. The eighth layer 36 is formed of $SiO_2$.

A ninth layer 38 is formed in contact with the eighth layer 36. The ninth layer 38 is formed of $Ta_2O_5$.

A tenth layer 40 is formed in contact with the ninth layer 38. The tenth layer 40 is formed of $SiO_2$.

In this way, the first layer 23 to the tenth layer 40 are successively laminated on the side of the rear facet 22, thereby forming the high reflection film 10.

The thicknesses of the second layer 24 to ninth layer 38 are, respectively, determined in the following manner. That is, the thicknesses of the second layer 24 to ninth layer 38 are those values obtained by dividing the oscillation wavelength λ of the semiconductor laser device by four times the refractive indices of the constituent materials of the respective layers. With a laser beam having an oscillation wavelength of 405 nm, the refractive index of $SiO_2$ is at about 1.5. On the other hand, the refractive index of $Ta_2O_5$ is at about 2.2. In this embodiment, $SiO_2$ is used as a low refractive index material and $Ta_2O_5$ used as a high refractive index material. The $SiO_2$ films and the $Ta_2O_5$ films are alternately superposed to increase the reflectance of the high reflection film 10.

The tenth film 40, which is a finally formed film of the high reflection film 10, is formed so as to increase the moisture resistance of the semiconductor laser device. The moisture resistance is one of parameters indicative of reliability of a laser device and indicates reliability of a laser device under environments such as of high humidity, high temperature and the like. The tenth layer 40 of this embodiment is so formed as to provide a thickness that is any value smaller than a value obtained by dividing the oscillation wavelength λ of the semiconductor laser device by four times the refractive index of the $SiO_2$ film.

The respective layers covering from the first layer 23 to the tenth layer 40 making up of the high reflection film 10 are formed by a CVD (chemical vapor deposition) method, a vacuum deposition method or a sputtering method and the like.

In general, problem concerning the high power semiconductor laser, COD is a most important problem to be solved. COD is a phenomenon which occurs due to the vicinity of a facet of a semiconductor laser becoming an optical absorption region. If the optical output density becomes high, local generation of heat in the vicinity of the facet becomes so great that the band gap is reduced. Eventually, positive feedback is established in which the absorption becomes greater, thereby inviting a further rise in temperature. Finally, the temperature of the absorption region arrives at a melting point thereby causing the crystals to be melted and result in a reduction in the COD threshold. This phenomenon may, in some case, be caused by the coating film becoming high in temperature, leading to deteriorated reliability. This problem of COD becomes more pronounced as the high output power continues. In order to ensure reliability of a semiconductor laser, care should be taken so as to avoid COD.

As one of causes for COD, mention is made of the high reflection film per se formed at the rear facet, which undergoes optical absorption and generation of heat. If optical absorption takes place in the high reflection film, an optical absorption loss and reflection loss are so great that not only characteristic degradation such as of an increase in operating current is invited, but also heat is generated in the high reflection film in itself by the optical absorption to cause local generation of heat to occur in the vicinity of the facet, finally making it impossible to obtain a desired optical output power as a result of reduction in a COD threshold. To avid this, it is necessary to suppress optical absorption of the high reflection film per se. In a conventional semiconductor laser as disclosed, for example, in the foregoing Patent Literature 1, however, an effective measure for preventing a temperature rise of the high reflection film is not taken and particularly, a difficulty is involved in realizing a high output performance of a 405 nm semiconductor laser.

The semiconductor laser device of this embodiment is able to suppress generation of heat by optical absorption at the high reflection film formed on the light reflection facet. This is because of the effect of this embodiment wherein the first layer 23 is formed as thin as about 10 nm. It is usual that the thicknesses of the respective layers forming the high reflection film are so selected as to be at values, each obtained by dividing the laser oscillation wavelength $\lambda$ by four times the refractive index n of the constituent material of each layer, i.e. at $\lambda/4n$. If, in this embodiment, the thickness of the first layer 23 is calculated in such a way as set out above, it becomes about 63 nm as mentioned hereinbefore. The first layer 23 of the embodiment has a thickness d that satisfies the equation (1) as described hereinbefore. Accordingly, the thickness d of the first layer 23 of the embodiment is, at least, smaller than 63 nm. In this embodiment, the thickness of the first layer 23 is set at 10 nm. The reliability of a laser device in case where the thickness d of the first layer 23 is smaller than $\lambda/4n$ is better than the reliability in the case where the thickness d is set at $\lambda/4n$. This is because when the thickness d of the first layer 23 is smaller than $\lambda/4n$, an increasing effect of preventing COD is achieved over the case where the thickness is at $\lambda/4n$. In this sense, it is favorable from the standpoint of reliability to set the thickness of the first layer 23 at smaller than $\lambda/4n$. In this embodiment, the first layer 23 satisfies this requirement and can suppress COD. It will be noted that the number symbol 63 that is a criterion used to determine the thickness of the first layer 23 may be changed to another value if the oscillation wavelength $\lambda$ or the refractive index n changes and thus, is not an absolute one.

In order to ensure adhesion that is one of roles of the first layer 23, it is sufficient that the first layer 23 has a thickness of about 1 nm. In view of the film formation control and ease in film formation of the $Al_2O_3$ film, the thickness of the first layer 23 is set at 10 nm in this embodiment. In this way, it is balanced to secure the adhesion between the high reflection film 10 and the light reflection facet 22 and to improve reliability of a laser device by improving the effect of preventing COD.

Figure 3:
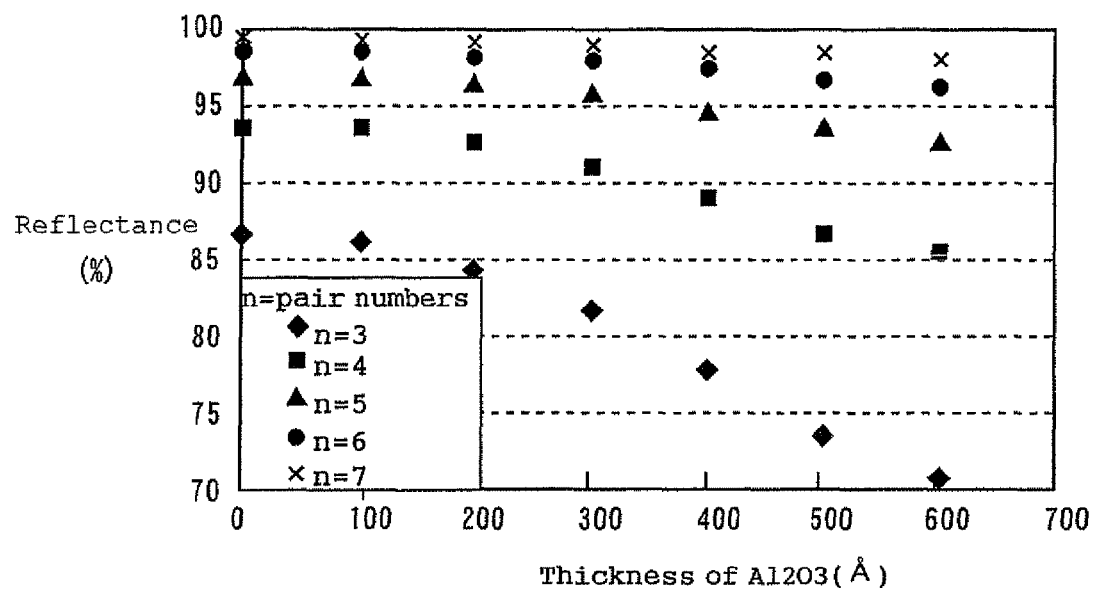
FIG. 3 is a graph showing the dependence of the reflectance of the high reflection film on the thickness of the first layer.

$Al_2O_3$, which has been accepted as not absorbing light when used in a conventional 780 nm semiconductor laser for CD and 660 nm semiconductor laser for DVD, may become a light absorber in a 405 nm semiconductor laser. It is suggested in Journal of Applied Physics, Vol. 88, No. 11, Dec. 1, 2000, pp. 6413-6417 that $Al_2O_3$ may become a light absorber. In FIG. 3 of the above non-patent literature, the intensity of cathode luminescence of $Al_2O_3$ depend on wavelength is shown. From this, it will be seen that $Al_2O_3$ has a light absorption characteristic over 300-500 nm. Hence, it is considered that the $Al_2O_3$ film formed at the light reflection facet generates heat by absorption of light and causes a reduction in the COD threshold. In this sense, the COD suppressing effect resulting from the thinning of the first layer 23 constituted of $Al_2O_3$ is not restricted within 405 nm semiconductor laser. More particularly, in all types of the semiconductor laser devices whose oscillation wavelength ranges about 300-500 nm, the thinning of the $Al_2O_3$ layer has a good effect on a reduction of absorption in the film and suppressing the COD threshold.

FIG. 3 is a graph showing the dependence of the reflectance of the high reflection film 10 on the thickness of the first layer 23. The results shown in FIG. 3 are those values obtained from theoretical calculation. It will be noted that "pair" of "pair numbers" indicated in graph legends of FIG. 3 means a double-layered structure made of a pair of $SiO_2$ and $Ta_2O_5$. This double-layered structure is one wherein the $Ta_2O_5$ thin film is placed on the $SiO_2$ thin film. For instances "pair number=3" means that three pairs of $SiO_2$ and $Ta_2O_5$ are placed between the first-layered $Al_2O_3$ film and the final-layered $SiO_2$ film. The final layer is intended to mean a finally formed layer of the high reflection film. The final layer indicates the tenth layer 40 in this embodiment. The meaning of the provision of a plurality of pairs of $SiO_2$ and $Ta_2O_5$ is to obtain a desired reflectance. As will be apparent from FIG. 3, a greater number of pairs generally result in a higher reflectance.

It has been generally accepted that a practically satisfactory reflectance is at about 90%. If the reflectance is 90% or over, an optical loss in the high reflection film can be suppressed. In this sense, the pair number n has been, in most cases, set at "4" or over and this embodiment provides a structure wherein the pair number is at 4. When the results of calculation of FIG. 3 are checked in case of the pair number being at 4, it will be seen that when the film thickness of $Al_2O_3$ exceeds 40 nm, the reflectance is below 90%. According, from the standpoint of the reflectance, the thickness of the $Al_2O_3$ film is preferably at 40 nm or below.

Summarizing the foregoing, while preventing COD with the high reflection film having adequate adhesion and satisfying the conditions where the reflectance of the high reflection film is 90% or over, the possible thickness of the $Al_2O_3$ serving as the first layer 23 is any value ranging 1 nm-40 nm. According to the arrangement of this embodiment, the thickness of the first layer 23 is formed at 10 nm, for which the above-stated effect can be obtained, thus enabling COD to be prevented while keeping a high reflectance of not smaller than 90%.

The thickness of the tenth layer 40, which is a final layer of this embodiment, is set at a value that is smaller than a value obtained by dividing the oscillation wavelength $\lambda$ by four times the refractive index of the $SiO_2$ film as described hereinabove. If the thickness of the tenth layer 40 is set at a value obtained by dividing the oscillation wavelength $\lambda$ by four times a refractive index like the second layer 24 to ninth layer 38, about 67 nm is obtained. Comparing a semiconductor laser which has a tenth layer 40 constituted of $SiO_2$ and having a thickness of any value smaller than 67 nm with a laser device wherein a tenth layer 40 is constituted of $SiO_2$ and has a thickness of 67 nm with respect to reliability (COD preventing effect), the former is better. Accordingly, the tenth layer 40 of this embodiment is set at a thickness of either smaller than 67 nm or a value obtained by dividing the oscillation wavelength $\lambda$ by four times the refractive index of $SiO_2$.

Figure 4:
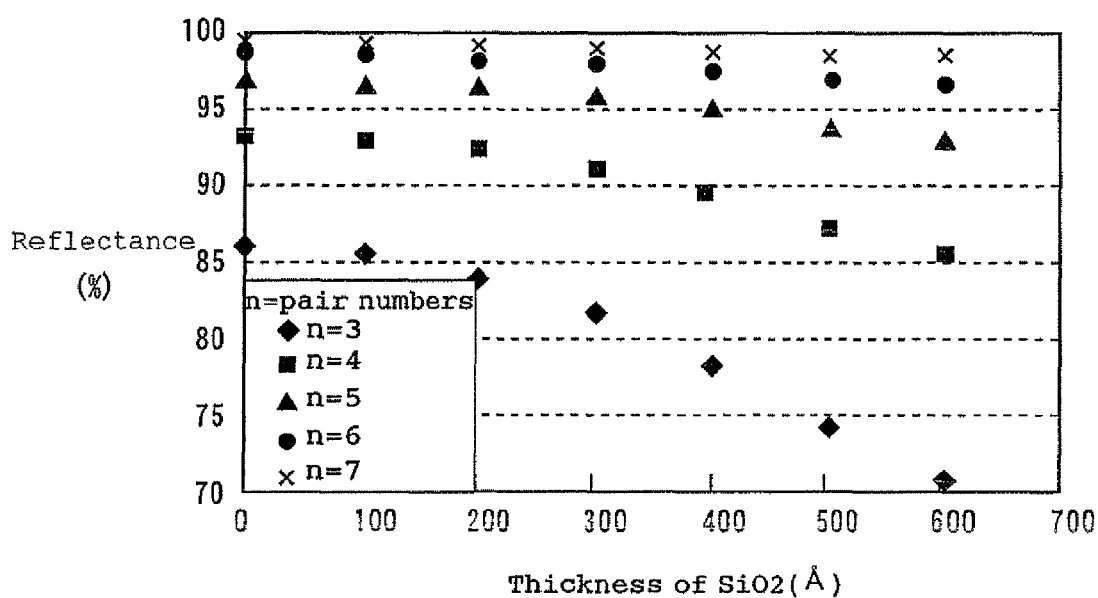
FIG. 4 shows an influence of thinning of the final layer on the reflectance of the high reflection film.

FIG. 4 shows an influence of thinning of the final layer 40 on the reflectance of the high reflection film 10. FIG. 4 shows the results of theoretical calculation. According to FIG. 4, in order to obtain a reflectance of 90% or over in case where the pair number is 4 as adopted in this embodiment, it is necessary that the thickness of the tenth layer 40 be any value of not larger than 40 nm. Accordingly, the thickness of the tenth layer 40 is preferably smaller than 67 nm from the standpoint of the COD preventing effect, and is preferably not larger than 40 nm from the standpoint of the reflectance.

Although the pair number of this embodiment is set at 4, the invention is not limited thereto. More particularly, the pair number n may take any value so far as a necessary reflectance is obtained.

Although $SiO_2$ is used as a low reflectance film in the even-number layers including the second layer 24, fourth layer 28, sixth layer 32 and eighth layer 36 in this embodiment, the invention should not be construed as limited thereto. More particularly, the effects of the invention can be obtained if the even-number layers forming the low reflectance film are made of any of $MgF_2$, NaF, $Ca_2F$, $CeF_3$, $LaF_3$, LiF, $NdF_3$ and other types of fluorides. Moreover, using $Al_2O_3$ in place of $SiO_2$ as low reflectance films except for the second layer 24, the effects of the invention can also be obtained.

Although, in this embodiment, odd-number layers except for the first layer 23 are used as the high reflectance film including the third layer 26, fifth layer 30, seventh layer 34 and ninth layer 38, the invention should not be construed as limited thereto. More particularly, the effects of the invention can be obtained if using high reflectance materials such as $Nb_2O_5$, $HfO_2$, $ZrO_2$, $Y_2O_3$, AlN, SiN and the like.

In this embodiment, the semiconductor laser has been illustrated, to which the invention is not limited. More particularly, the feature of the invention resides in facet coating, and the effects of the invention can be obtained using, as a light-emitting device, not only a semiconductor laser, but also those light-emitting devices such as LED (light-emitting diode) and the like.

The features and advantages of the present invention may be summarized as follows. According to the invention, the reliability of the semiconductor light-emitting device can be improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-121055, filed on May 1, 2007 including specification, claims, drawings and summary, on which the Convention priority of the present application is based, are incorporated herein by reference in its entirety.

What is claimed is:

1. A semiconductor laser device including semiconductor films on a substrate, comprising:
    a cavity extending in a propagation direction of a laser beam having wavelength λ;
    a first facet on a first end of the cavity and through which the laser beam is emitted;
    a second facet on a second end of the cavity and reflecting the laser beam; and
    a highly reflective film on said second facet and consisting of an insulating multi-layered film of at least three layers, wherein said highly reflective film comprises
        a first layer which is in contact with said second facet, is constituted of $Al_2O_3$, and has a thickness smaller than λ/4n wherein n is the refractive index of $Al_2O_3$,
        a second layer which is in contact with said first layer and is constituted of any of $SiO_2$, $MgF_2$, NaF, $Ca_2F$, $CeF_3$, $LaF_3$, LiF, and $NdF_3$, and
        a third layer which is in contact with said second layer and has a refractive index different from the refractive index of said second layer.

2. The semiconductor laser device according to claim 1, wherein
    said second layer is $SiO_2$, and
    said third layer is constituted of $Ta_2O_5$.

3. The semiconductor laser device according to claim 1, wherein
    said second layer is $SiO_2$,
    said third layer is $Ta_2O_5$, and
    said highly reflective film further comprises
        a fourth layer which is in contact with said third layer and is constituted of $SiO_2$,
        a fifth layer which is in contact with said fourth layer and is constituted of $Ta_2O_5$,
        a sixth layer which is in contact with said fifth layer and is constituted of $SiO_2$,
        a seventh layer which is in contact with said sixth layer and is constituted of $Ta_2O_5$,
        an eighth layer which is in contact with said seventh layer and is constituted of $SiO_2$, and
        a ninth layer which is in contact with said eighth layer and is constituted of $Ta_2O_5$, wherein said first layer has a thickness in the range from 1 nm to 40 nm.

4. The semiconductor laser device according to claim 1, wherein the oscillation wavelength λ is at 300-500 nm.

5. The semiconductor laser device according to claim 1, wherein
    said highly reflective film includes at least one pair, each pair including two layers having different refractive indices, and located behind said first layer,
    odd-numbered layers, except for said first layer, are any of $Ta_2O_5$, $Nb_2O_5$, $HfO_2$, $ZrO_2$, $Y_2O_3$, AlN, and SiN, and
    even-numbered layers, except for said second layer, are any of $Al_2O_3$, $SiO_2$, $MgF_2$, NaF, $Ca_2F$, $CeF_3$, $LaF_3$, LiF, and $NdF_3$.

6. The semiconductor laser device according to claim 1, wherein said highly reflective film includes a final layer located at a position most remote from said second facet and is constituted of $SiO_2$.

7. The semiconductor laser device according to claim 6, wherein said final layer has a thickness smaller than $\lambda/4n_1$, where $n_1$ is the refractive index of $SiO_2$.

8. A semiconductor laser device including a plurality of semiconductor films on a substrate, comprising:
    a cavity extending in a propagation direction of a beam of laser light generated within said light-emitting device, the laser light having a wavelength λ in a range from 300 nm to 500 nm;
    a first facet on a first end of the cavity and through which the beam of light is emitted;
    a second facet on a second end of the cavity and reflecting the beam of light; and
    a highly reflective film on said second facet, having a reflectivity at the wavelength λ of at least 70%, and consisting of an insulating multi-layer film including at least three layers, wherein said highly reflective film comprises
        a first layer contacting said second facet, consisting of $Al_2O_3$, and having a thickness smaller than λ/4n, wherein n is the refractive index of $Al_2O_3$,
        a second layer contacting said first layer and consisting of a film selected from the group consisting of $SiO_2$, $MgF_2$, NaF, $Ca_2F$, $CeF_3$, $LaF_3$, LiF, and $NdF_3$, and
        a third layer contacting said second layer and having a refractive index different from the refractive index of said second layer.

9. The semiconductor laser device according to claim 8, wherein
    said second layer is $SiO_2$, and
    said third layer is $Ta_2O_5$.

10. The semiconductor laser device according to claim 8, wherein
    said highly reflective film includes at least one pair of layers, each pair of layers including two layers having different refractive indices, and located farther from said second facet than said first layer,
    odd-numbered layers, except for said first layer, are selected from the group consisting of $Ta_2O_5$, $Nb_2O_5$, $HfO_2$, $ZrO_2$, $Y_2O_3$, AlN, and SiN, and even-numbered layers, except for said second layer, are selected from the group consisting of $Al_2O_3$, $SiO_2$, $MgF_2$, NaF, $Ca_2F$, $CeF_3$, $LaF_3$, LiF, and $NdF_3$.

11. The semiconductor laser device according to claim 8, wherein said highly reflective film includes a final layer, which is the layer of the highly reflective film that is located most remote from said second facet, consisting of $SiO_2$.

12. The semiconductor laser device according to claim 11, wherein said final layer has a thickness smaller than $\lambda/4n_1$, where $n_1$ is the refractive index of $SiO_2$.

13. The semiconductor laser device according to claim 11, wherein said first layer has a thickness in the range from 1 nm to 40 nm.

14. A semiconductor laser device including a plurality of semiconductor films on a substrate, comprising:
- a cavity extending in a propagation direction of a beam of laser light generated within said light-emitting device, the laser light having a wavelength $\lambda$, in a range from 300 nm to 500 nm;
- a first facet on a first end of the cavity and through which the beam of light is emitted;
- a second facet on a second end of the cavity and reflecting the beam of light; and
- a highly reflective film on said second facet, having a reflectivity at the wavelength $\lambda$ of at least 70%, and consisting of an insulating multi-layer film, wherein said highly reflective film comprises
  - a first layer contacting said second facet, consisting of $Al_2O_3$, and having a thickness in a range from 1 nm to 40 nm and smaller than $\lambda/4n$, wherein n is the refractive index of $Al_2O_3$,
  - a second layer contacting said first layer and consisting of a film of $SiO_2$,
  - a third layer contacting said second layer and consisting of $Ta_2O_5$,
  - a fourth layer contacting said third layer and consisting of $SiO_2$,
  - a fifth layer contacting said fourth layer and consisting of $Ta_2O_5$,
  - a sixth layer contacting said fifth layer and consisting of $SiO_2$,
  - a seventh layer in contacting said sixth layer and consisting of $Ta_2O_5$,
  - an eighth layer contacting said seventh layer and consisting of $SiO_2$, and
  - a ninth layer contacting said eighth layer and consisting of $Ta_2O_5$.

15. The semiconductor laser device according to claim 14, wherein each of said second, third, fourth, fifth, sixth, seventh, eighth, and ninth layers has a thickness of $\lambda/4n_1$, where $n_1$ is the refractive index of the respective layer.

16. The semiconductor laser device according to claim 14, wherein said highly reflective film includes a tenth layer contacting said ninth layer and consisting of $SiO_2$.

17. The semiconductor laser device according to claim 16, wherein said tenth layer has a thickness smaller than $\lambda/4n_1$, where $n_1$ is the refractive index of $SiO_2$.

* * * * *